US007203070B2

(12) United States Patent
Weisz-Margulescu et al.

(10) Patent No.: US 7,203,070 B2
(45) Date of Patent: Apr. 10, 2007

(54) SEALED ELECTRONIC INPUT/OUTPUT MODULE

(75) Inventors: Adam Weisz-Margulescu, Thornill (CA); Alan Albino, Woodbridge (CA); Roger Robichaud, Newmarket (CA)

(73) Assignee: Tyco Electronics Canada, Ltd., Markham, Ontario (CA)

( * ) Notice: Subject to any disclaimer, the term of this patent is extended or adjusted under 35 U.S.C. 154(b) by 54 days.

(21) Appl. No.: 10/726,435

(22) Filed: Dec. 3, 2003

(65) Prior Publication Data

US 2005/0122696 A1 Jun. 9, 2005

(51) Int. Cl.
*H05K 5/02* (2006.01)

(52) U.S. Cl. ...................... 361/752; 361/728; 361/730; 439/76.2; 174/520

(58) Field of Classification Search ................ 361/752, 361/728, 730, 736, 829, 837, 832–34; 174/50, 174/52.1, 52.3, 58, 60, 63, 520, 522; 220/4.02; 248/906; 439/535, 76.1, 76.2
See application file for complete search history.

(56) References Cited

U.S. PATENT DOCUMENTS

| | | | | |
|---|---|---|---|---|
| 5,148,348 | A * | 9/1992 | White | 361/658 |
| 5,386,084 | A * | 1/1995 | Risko | 174/52.3 |
| D361,059 | S * | 8/1995 | De Waal | D13/177 |
| 5,532,431 | A * | 7/1996 | Saka et al. | 174/52.3 |
| 5,777,843 | A * | 7/1998 | Younce | 361/641 |
| 5,812,373 | A * | 9/1998 | Hwang | 361/704 |
| 5,928,004 | A * | 7/1999 | Sumida et al. | 439/76.2 |
| 5,995,380 | A * | 11/1999 | Maue et al. | 361/826 |
| 6,072,389 | A | 6/2000 | Strasburger | |
| 6,317,675 | B1 | 11/2001 | Stolzl et al. | |
| 6,350,949 | B1 * | 2/2002 | Boyd | 174/50.5 |
| 6,424,520 | B1 * | 7/2002 | Cornell et al. | 361/648 |
| 6,430,036 | B1 * | 8/2002 | Cornell et al. | 361/648 |
| 6,563,046 | B1 * | 5/2003 | Jarry et al. | 174/50 |

* cited by examiner

*Primary Examiner*—Tuan Dinh
*Assistant Examiner*—Dameon E. Levi

(57) ABSTRACT

An electronic module includes an insulative housing and at least one circuit board contained within the housing. A plurality of connectors are coupled to the circuit board, and at least some of the connectors accessible through a surface of the housing. At least one fuse is electrically connected to the circuit board, and an insulative fuse door is sealingly engaged to the housing and positionable with respect to the housing to provide access to the fuse from an exterior of the housing.

20 Claims, 6 Drawing Sheets

SEALED ELECTRONIC INPUT/OUTPUT MODULE

BACKGROUND OF THE INVENTION

The invention relates generally to electronic packages, and, more particularly, to sealed electronic packages for use in rugged environmental conditions.

The proliferation of electronic devices in modern vehicles creates a number of manufacturing challenges in packaging the electronic devices to adequately protect electronic components and ensure reliable operation thereof. Especially for electronic packages which are mounted on the exterior of a vehicle, providing adequate protection for electronics can become a daunting task.

For example, electronic monitoring of brake wear for trucks, buses, and larger vehicles has become desirable to ensure proper performance of the vehicle and to comply with applicable regulations. By sensing an operating condition of the brakes for the vehicle or trailer, a warning signal may be provided to an operator of the vehicle, such as through a dashboard light or indicator, that one or more of the vehicle brakes should be serviced. Unacceptable or dangerous operating conditions may therefore be avoided, and inconvenient physical inspection of the brakes need not be as frequent.

As the number of monitored brakes increases in a vehicle, wiring the brake sensors to the vehicle dashboard is problematic, as the dashboard area is not easy to access and space is limited. While this difficulty may at least be partially overcome by connecting the wires to a separate indicator away from the dashboard on the vehicle interior, connecting a large number of wires to such an indicator can be unsightly and undesirable.

It has been proposed to interconnect the brake sensors at a location exterior to the vehicle and to provide only one signal line to the vehicle dashboard or vehicle interior. Known input/output modules, however, are not suitable for use on the exterior of a vehicle, and typically entail a number of separately provided connector components which add to the cost of the system and introduce reliability issues.

BRIEF DESCRIPTION OF THE INVENTION

According to an exemplary embodiment, an electronic module is provided. The module comprises an insulative housing and at least one circuit board contained within the housing. A plurality of connectors are coupled to the circuit board, and at least some of the connectors are accessible through a surface of the housing. At least one fuse is electrically connected to the circuit board, and an insulative fuse door is sealingly engaged to the housing and positionable with respect to the housing to provide access to the fuse from an exterior of the housing.

Optionally, the module includes a connector portion and a cover portion sealingly engaged to the connector portion. The connector portion comprises a plurality of molded connector receptacles, and the connectors are configured to engage 0.64 GET terminal system connectors. The fuse door is removable from the housing and is curved on one side thereof.

According to another embodiment, an electronic input/output module is provided. The module includes an insulative housing having a plurality of integrally formed connector receptacles, at least one printed circuit board contained within the housing, a plurality of connectors coupled to the circuit board and extending into the connector receptacles, and at least one fuse electrically connected to the circuit board. An insulative fuse door is sealingly engaged to the housing and positionable to provide access to the fuse from an exterior of the housing.

According to another embodiment, an electronic control module is provided. The control module includes an insulative housing comprising a connector portion having a plurality of integrally formed connector receptacles, and a cover portion sealingly engaged to the connector portion opposite the connector portion. At least one printed circuit board is contained within the housing, and a plurality of connectors are coupled to the circuit board and extend into the connector receptacles. At least one fuse is electrically connected to the circuit board, and an insulative fuse door is removably engaged to the cover portion. The fuse door includes a seal providing a moisture proof barrier when the fuse door is attached to the housing.

DETAILED DESCRIPTION OF THE INVENTION

Figure 1:
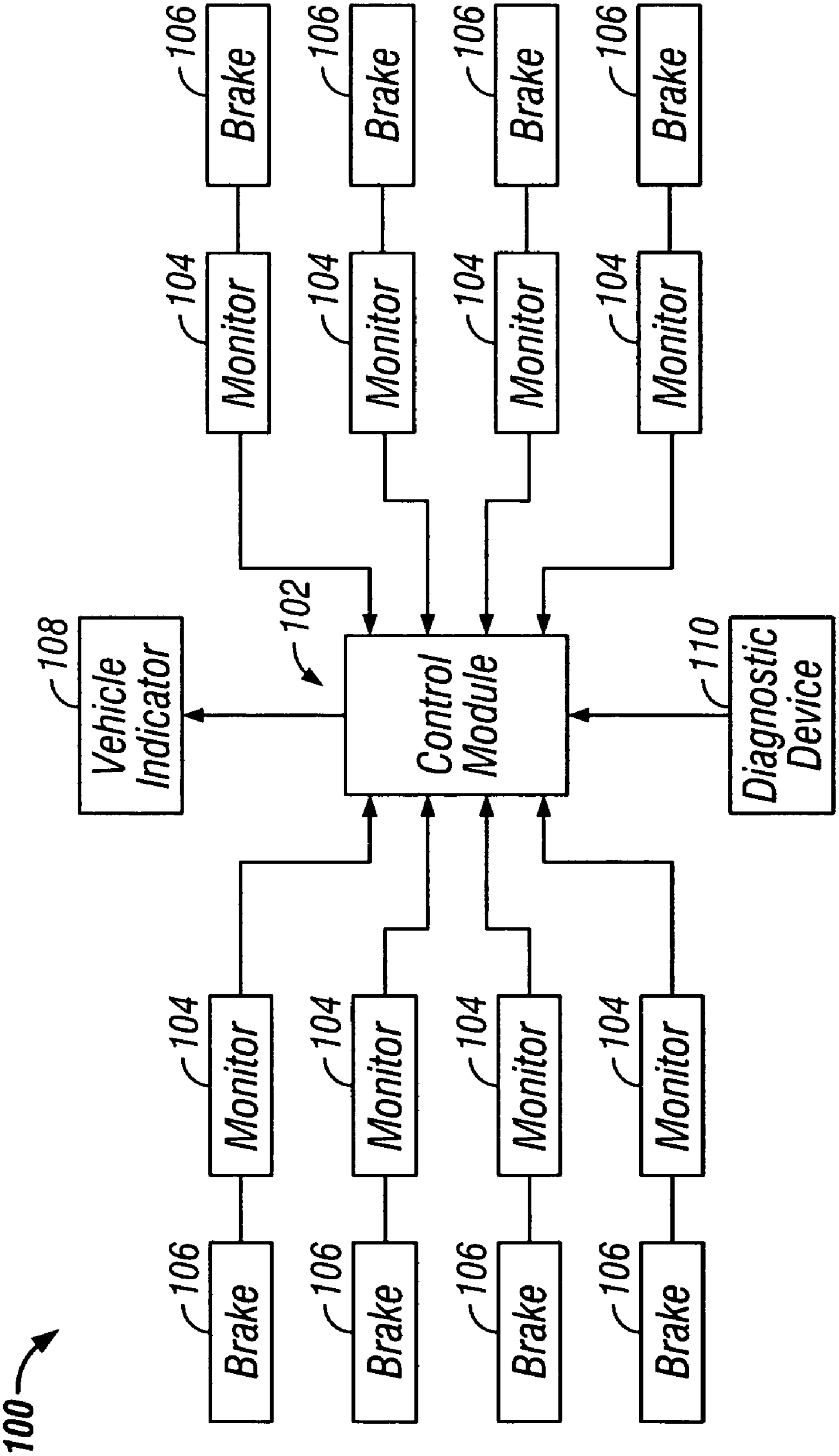
FIG. 1 is a schematic diagram of an exemplary brake wear monitor system in which the present invention may be employed.

FIG. 1 is a schematic diagram of an exemplary brake wear monitor system 100 in which the present invention may be employed. It is understood, however, that the benefits of the invention may be realized in other applications, and the brake wear monitor system 100 is but one example of an end use of the invention. The following description is therefore provided for purposes of illustration rather than limitation.

As illustrated in FIG. 1, the brake wear monitor system 100 includes a sealed control module 102 which is operatively responsive to signals generated by a plurality of electronic monitors 104 associated with the brake assemblies 106 of a vehicle (not shown), such as for example, a truck and trailer combination. While eight different brake assemblies 106 are illustrated in FIG. 1, it is understood that a greater or fewer number of brake assemblies 106 and monitors 104 may be coupled to the control module 102 as desired to accommodate a variety of vehicles, trailers, etc. in various alternative embodiments.

While the brake assemblies 106 and monitors 104 are mounted proximate the wheels of the vehicle, the control module 102 is located at a remote location on the vehicle and receives input signals from the monitors 104 indicative of the condition of the brake assemblies 106. Electronics in the control module 102 process the input signals and, as necessary or as desired, outputs a signal to an indicator 108 in the vehicle, such as a dashboard indicator, to alert the vehicle operator of the condition of the brake assemblies 106. As such, the monitors 104 are wired to the control module 102, and the control module 102 provides a single output to the vehicle indicator 108. Numerous direct connections from the monitors 104 to the indicator 108 are avoided.

Additionally, in a further embodiment, the control module 102 may receive input from a diagnostic device 110, such as a portable computer, for diagnostic purposes, control software updates and modification, downloading of data, and other functions. The control module 102 in an exemplary embodiment is located external to the vehicle for convenient connection to the monitors 104 and to provide access to the module 102 for diagnostics, and as explained below, to provide direct access to one or more fuses in the control module 102. In one embodiment, the control module 102 is mounted underneath the vehicle on the vehicle chassis in an accessible location for servicing thereof.

The accessibility of the control module 102 from the exterior of the vehicle, however, subjects the module 102 to an extreme operating environment. The module 102 is exposed to varying temperature, pressure and moisture conditions, as well as exposed to a variety of engine fluids, lubricants, grease, brake fluids, debris, gravel, roadway composition coatings and by-products. The control module 102 is therefore constructed and sealed as described below to protect the internal electronics from harsh environmental conditions to ensure reliable operation of the system 100.

Figure 2:
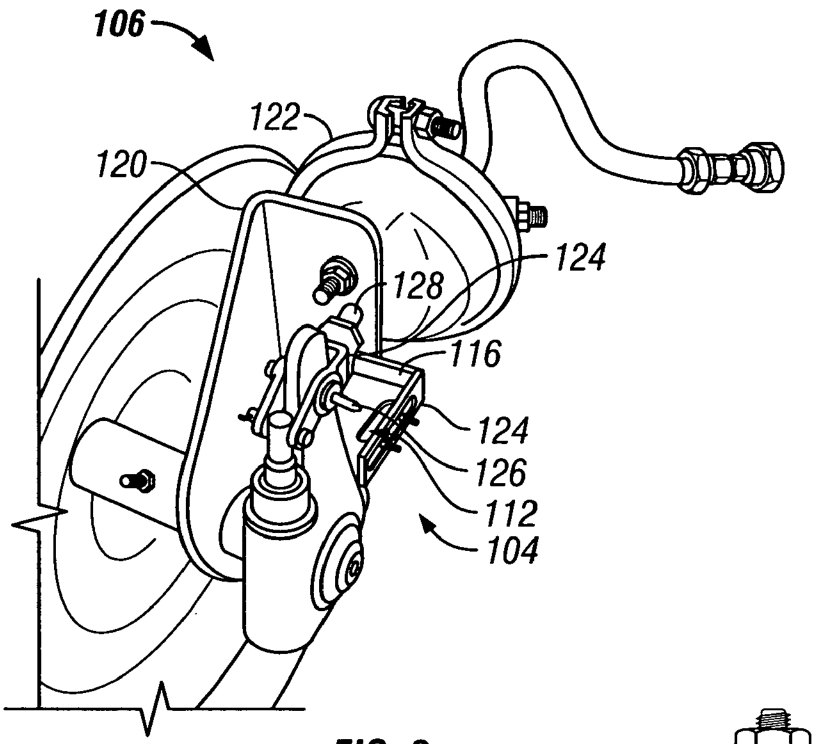
FIG. 2 is a perspective view of an exemplary brake assembly including an electronic brake stroke monitor with which the present invention may be employed.

FIG. 2 illustrates an exemplary brake monitor 104 mounted proximate an exemplary brake assembly 106 upon a bracket 112 having an attachment portion 116 at one end. The attachment portion 116 has a opening therethrough (not shown in FIG. 1) which allows the bracket 104 to be attached to a chamber mounting bracket 120 which supports a brake chamber 122 of the brake assembly 106. The brake chamber 122 includes a clevis assembly 124 having a clevis pin 126 and a brake arm 128.

The brake assembly 106 is a spring-assisted assembly of a known type that is commonly employed for braking of trucks, buses, and towed vehicles such as trailers. In normal braking operation, the brake arm 128 actuates the chamber 122 to apply and release brake pads (not shown) in response to an operator directed delivery and exhaust of a compressed fluid, such as air.

As the vehicle's brakes are applied over time, the brake pads are worn away, resulting in an increase in the stroke of the brake arm 128 needed to apply the necessary braking force. The stroke of the brake arm 128 can also change if the brakes are out of adjustment. Thus, the length of travel of the brake arm 128 is an indicator of brake wear or improper brake adjustment.

In one embodiment, the monitor 104 includes hall effect sensors, and the voltage across the sensors varies depending on the location of the pin 126 relative to the monitor 104. Therefore, by monitoring the voltage across the sensors, the monitor 104 may deduce the location of the pin 126 and hence the stroke of the brake arm 128 in use. While one exemplary monitor 104 has been described, it is contemplated that in alternative embodiments other types of electronic monitors may be employed to sense or determine an operating condition of the brake assembly 106 and output appropriate signals to the control module 102 (shown in FIG. 1).

The stroke of the brake arm 128 is sensed by the electronic monitor 104 via movement of the clevis pin 126, which moves with the brake arm 128 during use. A corresponding signal is sent from the electronic monitor 104 to the control module 102 (shown in FIG. 1), and when the pin 126 travels a specified distance, corresponding to a predetermined brake wear condition, the control module 102 sends a signal to a remote location, such as the indicator 108 (shown in FIG. 1) positioned, for example, on the vehicle dashboard. An unacceptable brake condition may therefore be identified and the operator may respond accordingly.

The electronic monitor 104 is mounted a predetermined distance, such as about 0.25 inches in an exemplary embodiment, from the clevis pin 126. The electronic monitor 104 is oriented generally parallel to the clevis assembly 124 such that when the brake assembly 106 is in a fully released position, the clevis pin 126 sits at a predetermined location with respect to the monitor 104. When the brake assembly 106 is applied, the clevis pin 126 moves in a direction parallel to the monitor 104, and by sensing the amount of movement of the clevis pin 126, the brake stroke may be determined as acceptable or unacceptable as described below.

Figure 3:
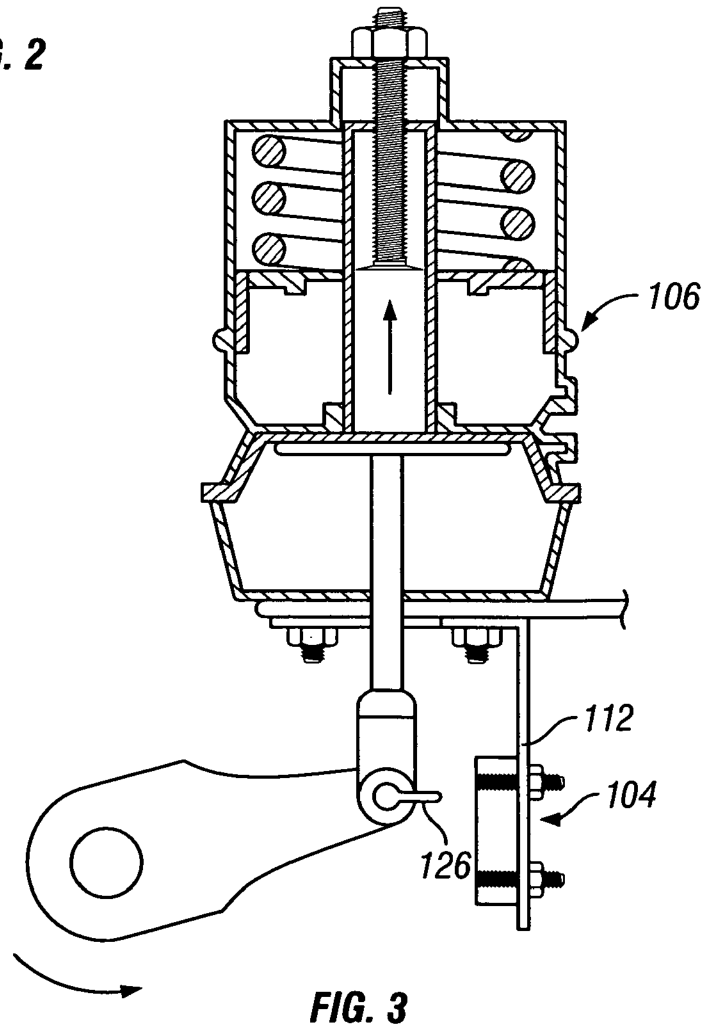
FIG. 3 is a top plan view of the brake assembly in a first position relative to the brake stroke monitor.
Figure 4:
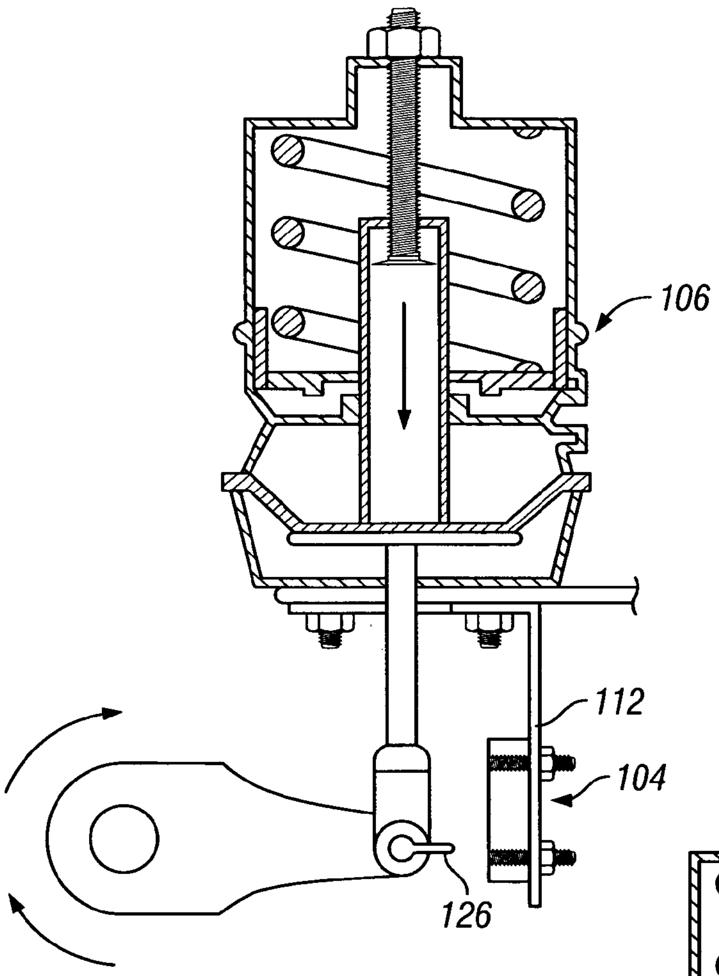
FIG. 4 is top plan view of the brake assembly in a second position relative to the brake stroke monitor.
Figure 5:
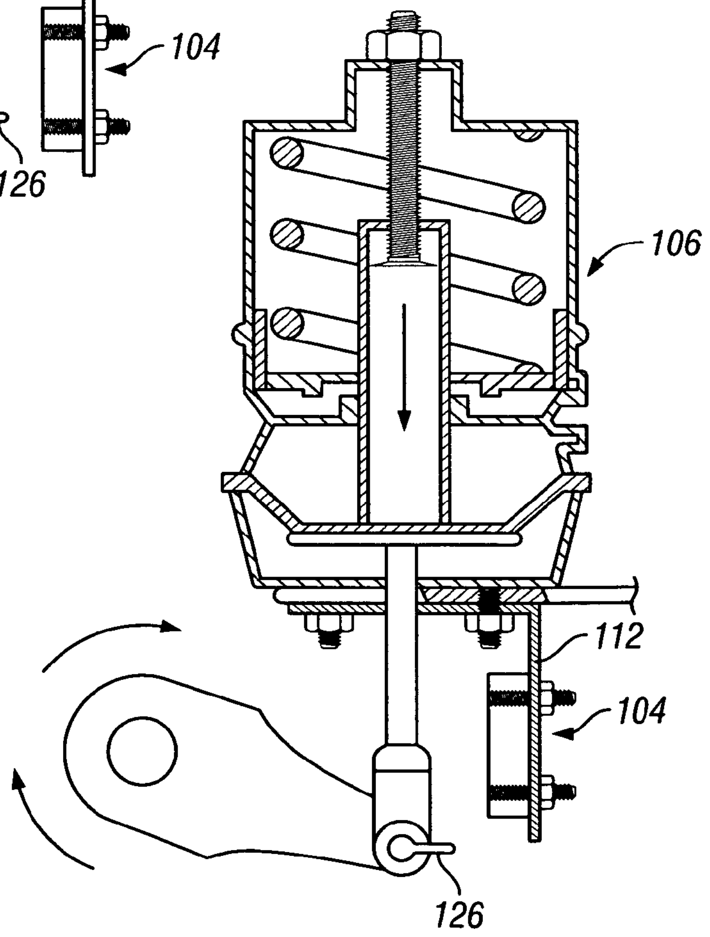
FIG. 5 is top plan view of the brake assembly in a third position relative to the brake stroke monitor.

FIG. 3–5 illustrate the brake monitor 104 at different stages or conditions of the brake assembly 106. Initially, the clevis pin 126 is orientated at a predetermined full brake position with respect to the monitor 104. At this stage of operation, the brake pads are worn little, if any, and the brake stroke is relatively small. Signals from the break wear monitor 104 are processed by the control module 102 (shown in FIG. 1) and are determined to be acceptable. Accordingly, the control module 102 at this stage does not signal an operator of a brake condition that warrants attention.

Over time, and as the brake assembly 106 is used, the brake pads wear and the brake stroke increases as illustrated in FIG. 4. The clevis pin 126 moves to a further position which also coincides with an acceptable brake stroke for the vehicle on which the brake monitor 104 is installed. At this stage of operation, the brake pads are moderately worn and the brake stroke is larger, but still within acceptable limits. The brake wear monitor 104 signals the control module 102 which determines the brake stroke to be within acceptable limits, and the control module 102 does not signal an operator of a brake condition that warrants attention.

As the brake assembly 106 continues to be applied, the brake pads wear and the brake stroke increases further as illustrated in FIG. 5. When the brakes become severely worn, the clevis pin 126 moves beyond a predetermined threshold position. At this stage of operation, the brake pads are unacceptably worn, and the brake monitor 104 produces an output signal to the control module 102 which causes the control module 102 to signal an operator that the brake assembly 106 is in an unacceptable operating condition and that the brake assembly 106 should be serviced as soon as possible.

Figure 6:
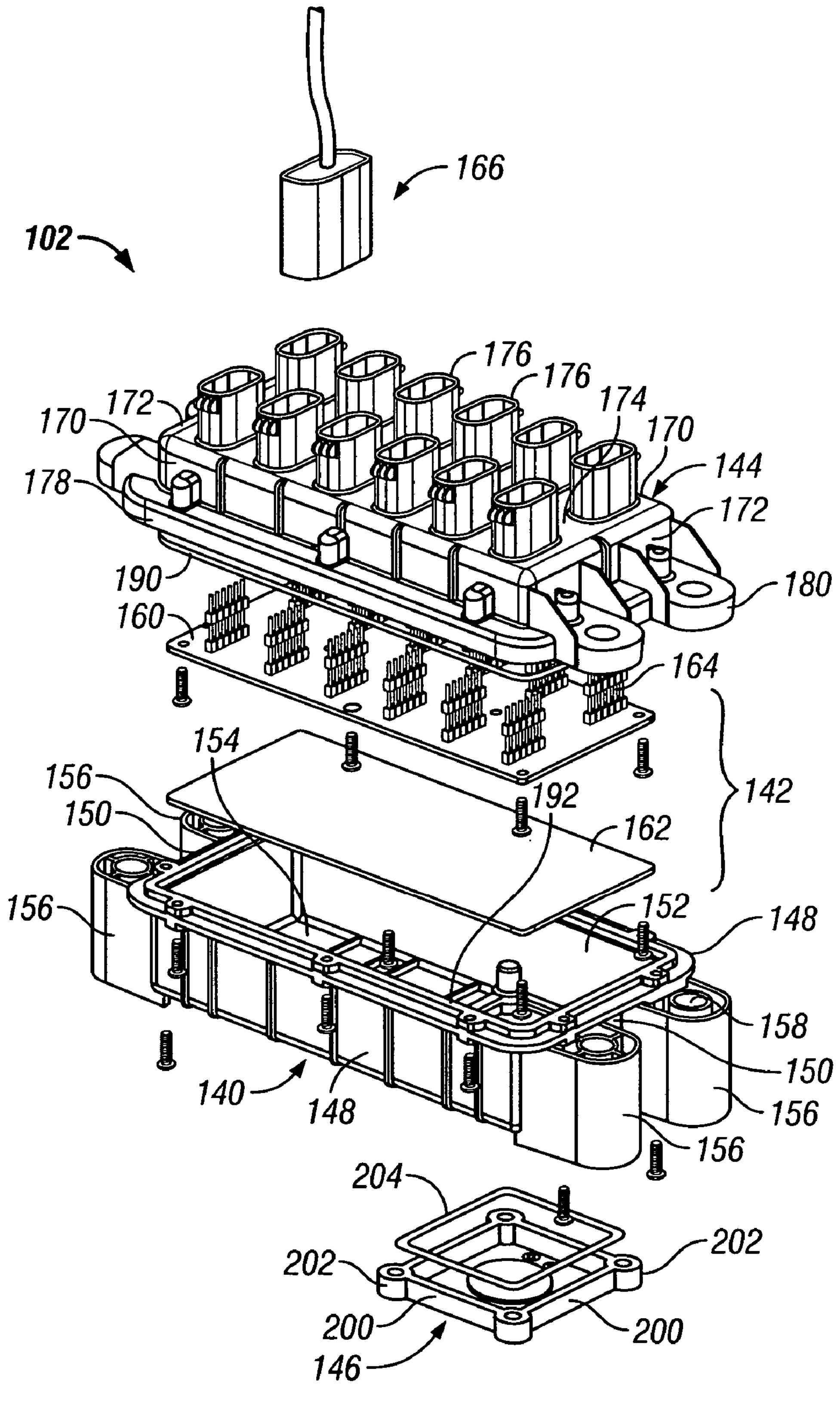
FIG. 6 is a top exploded view of a control module for the system shown in FIG. 1 formed in accordance with an embodiment of the present invention.

FIG. 6 is a top exploded view of the control module 102 formed in accordance with an exemplary embodiment of the present invention. In the illustrated embodiment, the control module 102 includes a cover housing 140, an electronic assembly 142, a connector housing 144, and a fuse access door 146.

The cover housing 140 includes side walls 148 and end walls 150 extending between the side walls 148 and forming a substantially rectangular recess or cavity 152 which receives the electronic assembly 142. The fuse access door 146 is coupled to a floor 154 extending between the side walls 148 and the end walls 150, and together the floor 154 and the door 146 close the bottom end of the cover housing 140 to protect the electronic assembly 142. Rounded mounting lugs or formations 156 extend from the end walls 150 of the cover housing, and the mounting lugs 156 include bores 158 extending therethrough. Known fasteners (not shown) may be extended through the bores 158 of the mounting lugs 156 to mount the control module 102 to, for example, a chassis or frame of the vehicle. Four mounting lugs 156 are provided in one embodiment, although it is appreciated that greater or fewer mounting lugs 156 may be provided in alternative embodiments.

The cover housing 140 is fabricated from an insulative, heavy duty plastic according to known techniques. While in the illustrative embodiment the cover housing 140 is formed into an elongated rectangular shape, it is understood that other shapes of the housing 140 may be implemented as desired without departing from the scope and spirit of the invention. Likewise, while the mounting lugs 156 in the illustrated embodiment are round or cylindrical with bores 158 extending therethrough, it is recognized that a variety of shapes and configurations of the mounting lugs 156 may be provided, with or without bores 158, in various alternative embodiments.

The electronic assembly 142 in one embodiment includes a first circuit board 160 and a second circuit board 162. The first circuit board 160 includes a plurality of connectors 164 mounted thereto and extending upward therefrom in a substantially perpendicular orientation with respect to the first circuit board 160. In an exemplary embodiment, the connectors 164 are AMPMODU II square pin/header connectors commercially available from Tyco Electronics of Harrisburg, Pa. The AMPMODU connectors are particularly advantageous for the control module 102 because they provide for mating engagement with female contacts (not shown) of a six position 0.64 GET terminal system connector 166 (one of which is shown in FIG. 6), also commercially available from Tyco Electronics of Harrisburg, Pa. Plug connector 166 interface the respective brake monitors 104 (shown in FIGS. 1–5) with the control module 102 as described below.

The second circuit board 162 is interconnected with the first circuit board 160, and the circuit boards collectively define circuitry for processing signals from the brake monitors 104. The second circuit board 162 is electrically connected to fuses (not shown in FIG. 6) which protect the electronic components of the assembly 142 from electrical overloads and malfunction. While two circuit boards 160, 162 are included in an illustrative embodiment, it is understood that greater or fewer numbers of circuit boards may be utilized in different applications as desired or as necessary to meet particular specifications of the control module 102.

The connector housing 144 is fabricated from insulative, heavy duty plastic according to known techniques and is fitted to the cover housing 140 to form an enclosure over the electronic assembly 142. The connector housing 144 includes side walls 170 and end walls 172 in a substantially rectangular configuration, and a top surface 174 extends between the side walls 170 and the end walls 172. A plurality of connector receptacles 176 extend upward from the top surface 174, and each receptacle 176 corresponds to a respective connector 164 of the first circuit board 160. That is, each connector 164 is received within and surrounded by one of the receptacles 176 of the connector housing 144. The connectors 164 are therefore exposed or accessible through the top surface 174 within the receptacles 176, and each of the receptacles 176 may be matingly engaged with one of the plug connectors 166 to mate the plug contacts with the connectors 164. In one embodiment the receptacles 176 are integrally formed with the connector housing 144 according a known molding process. Thus, by forming the receptacles 176 into the connector housing 144, connector components otherwise needed to couple the plug connectors 166 may be avoided.

In one embodiment, twelve receptacles 176 are provided in six pairs on the connector housing 144, although greater or fewer receptacles may be provided in alternative embodiments.

A rim 178 extends around the lower periphery of the connector housing 144, and mounting lugs 180 extend outward from the rim 178 such that when the connector housing 144 and the cover housing 140 are fitted together, the lugs 180 of the connector housing 144 align with the lugs 156 of the cover housing 140. Mounting elements 182 are provided alongside the side walls 170 of the connector housing 144, and the mounting elements 182 are internally threaded for coupling the connector housing 144 to the cover housing 140.

A gasket seal 190 is provided for moisture proofing the interface between the cover housing 140 and the connector housing 144, and the seal 190 is shaped similarly to the rim 178 of the connector housing. The seal 190 extends around and is substantially co-extensive with the perimeter of the rim 178 and is compressed between the cover housing 140 and the connector housing 144 when the housings 140 and 144 are engaged. More specifically, the seal 190 is seated within a groove (not shown in FIG. 6) and a seal rim 192 of the cover housing 140 compresses the seal 190 within the groove. The seal 190 is fabricated from known materials, such as silicon rubber, according to known techniques.

The fuse access door 146 is formed from a heavy duty plastic according to known techniques and includes side walls 200 in a generally square configuration with mounting lugs 202 located at the four corners thereof. Fasteners (not shown), such as threaded fasteners, may be inserted through the lugs 202 to secure the access door 146 to the cover housing 140. A gasket seal 204 is provided around the periphery of the door 146 and is compressed between the door 146 and the cover housing 140 when the door 146 is engaged to the housing 140, thereby providing a moisture-proof barrier to protect the electronic assembly 142. The seal 204 is fabricated from known materials, such as silicon rubber, according to known techniques.

Figure 7:
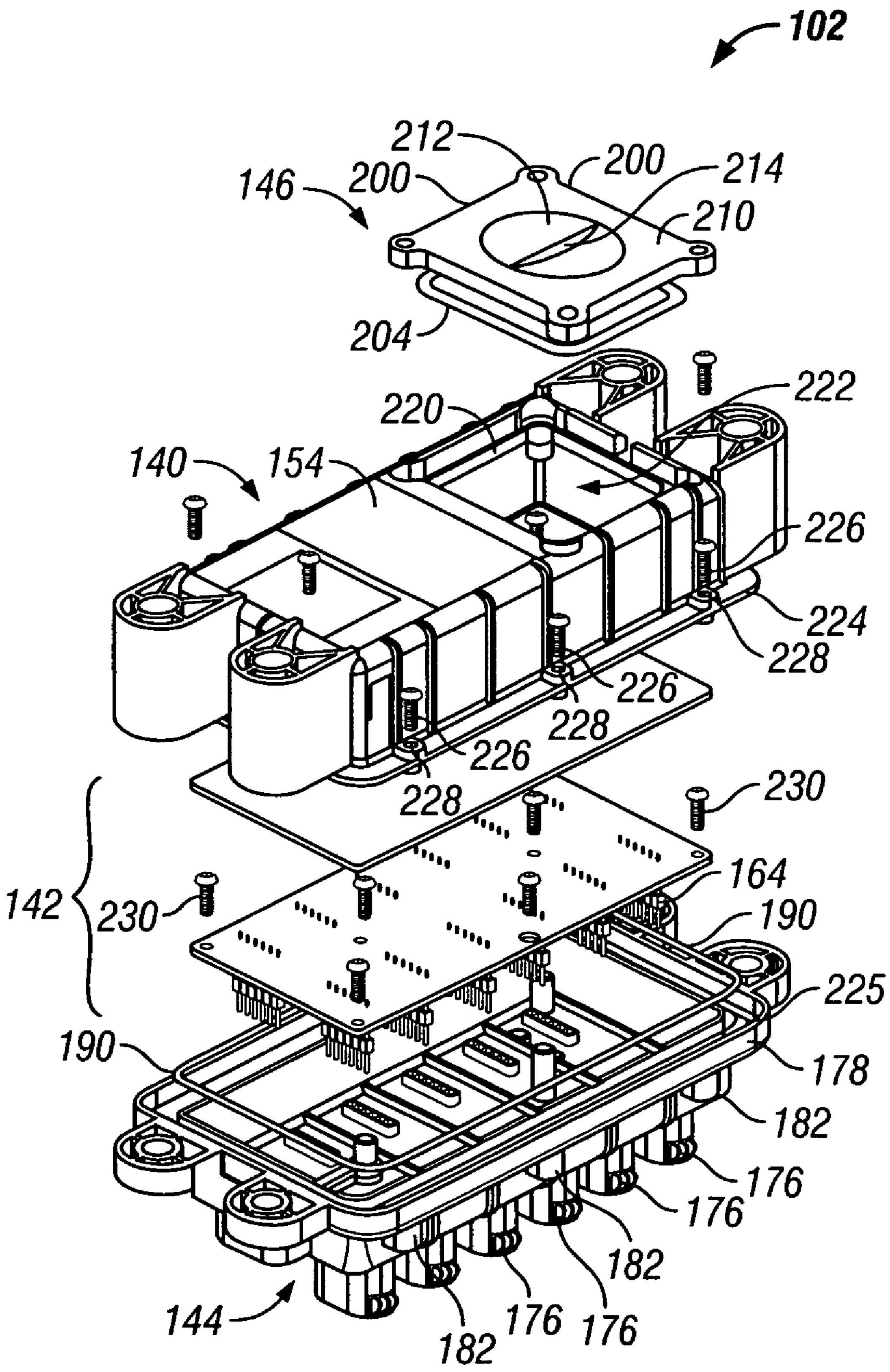
FIG. 7 is a bottom exploded perspective view of the control module shown in FIG. 6.

FIG. 7 is a bottom exploded perspective view of the control module 102. The fuse access door 146 includes an outer surface 210 extending between the side walls 200, and the outer surface 210 includes a depressed section 212 having an upstanding handle 214 formed therein. The depressed section 212 is concave as described further below, while the handle 214 remains substantially flush with the outer surface 210 of the door 146. The curvature of the depressed section 212 allows a user to grip the handle 214 with two fingers when installing or removing the door 146.

The seal 204 extends below the door 146 and seats upon a shoulder 220 in the cover housing 144 which defines an opening 222 in the floor 154 thereof. The opening 222 provides for insertion and removal of known fuses (not shown in FIG. 7) associated with the electronic assembly 142. When the fuse access door 146 is attached to the cover housing 140, the door 146 closes and seals the opening 222 via the seal 204.

A rim 224 is provided on the lower portion of the cover housing 140 opposite the fuse door 146. The rim 224 aligns with and engages to the rim 178 of the connector housing 144. Fasteners 226 extend through apertures 228 in the rim 224 of the cover housing 140 and extend into the mounting elements 182 of the connector housing 144 to couple the cover housing 140 to the connector housing 144. The seal 190 is fitted within a groove 225 in the connector housing 144, and when the fasteners 226 are tightened, the seal 190 is compressed within the groove by the sealing rim 192 (shown in FIG. 6) of the cover housing 140 to seal the electronic assembly 142 within the housings 140 and 144.

The first circuit board 160 is fastened to the connector housing 144 with fasteners 230, and each of the connectors 164 mounted to the first circuit board 160 are extended into one of the receptacles 176.

Figure 8:
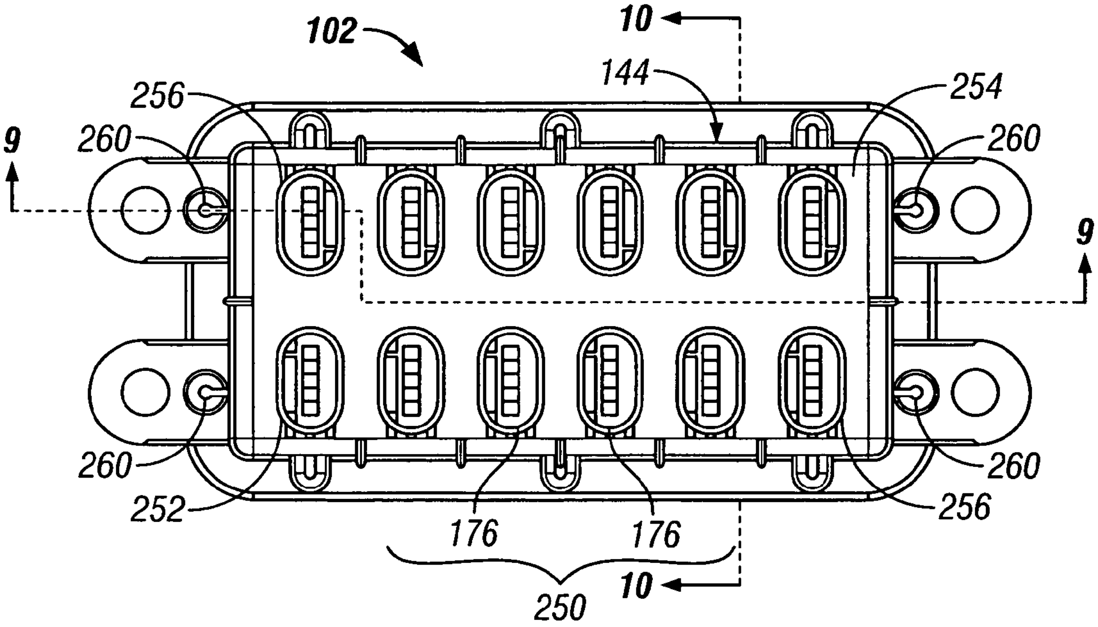
FIG. 8 is a top plan view of the control module shown in FIGS. 6 and 7.

FIG. 8 is a top plan view of the assembled control module 102. As illustrated in FIG. 8, the receptacles 176 of the connector housing 144 are designated as monitor input receptacles 250 for the left and right brake assemblies 106 (shown in FIG. 1) of the vehicle, a control module input receptacle 252, a control module output receptacle 254, and two communications receptacles 256. When a mating plug connector 166 (shown in FIG. 6) is connected to the appropriate receptacle, the control module 102 receives signals from the brake monitors 104 with the receptacles 250, outputs a signal to the indicator 108 (shown in FIG. 1) via the receptacle 256, and is responsive to the diagnostic device (shown in FIG. 1) with the receptacles 252 and 256 for collecting data, updating control software, troubleshooting, etc.

Figure 9:
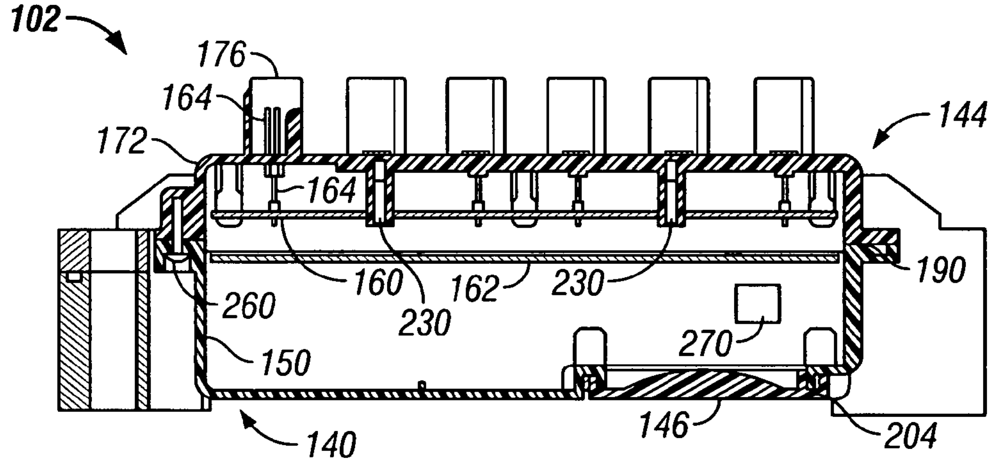
FIG. 9 is a cross sectional view of the control module along line 9—9 of FIG. 8.

FIG. 9 is a cross sectional view of the control module 102 along line 9—9 of FIG. 8. The cover housing 140 and the connector housing 144 are attached to one another with the fasteners 226 (shown in FIG. 7) and also with fasteners 260 adjacent the end walls 150 and 172 of the respective housings 140 and 144. The seal 190 is compressed between the housings 140 and 144. The first circuit board 160 is attached to the connector housing 104 with fasteners 230 and the connectors 164 extend from the first circuit board 160 into the receptacles 176 of the connector housing 144. The second circuit board 162 is spaced from the first circuit board 160, electrically connected to the first board 160, and is electrically connected to a known fuse 270 (shown schematically in FIG. 9). A circuit is completed through a fuse 270, and the fuse opens in the event of an electrical overload, thereby breaking the electrical circuit to isolate electronic components on the circuit boards 160 and 162 from damaging currents. The fuse 270 is located proximate the fuse access door 146 such that, when the door 146 is removed, the fuse 270 is accessible for replacement. The seal 204 of the door 146 is compressed between the door 146 and the cover housing 140, thereby sealing the opening 222 (shown in FIG. 7).

Figure 10:
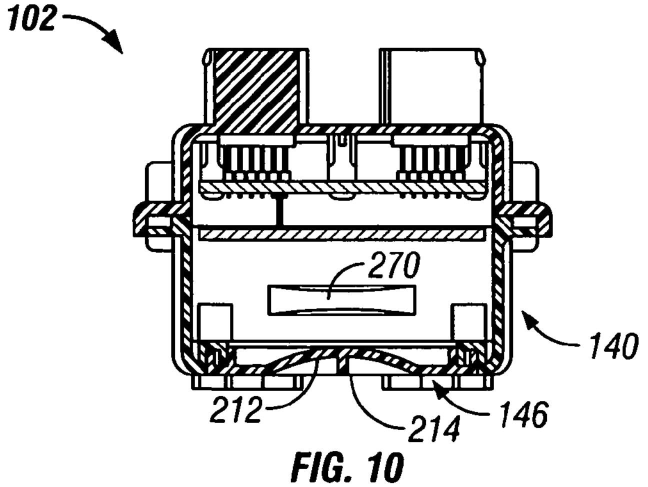
FIG. 10 is a cross sectional view of the control module along line 10—10 of FIG. 8.

FIG. 10 is a cross sectional view of the control module 102 along line 10—10 of FIG. 8 illustrating the fuse access door 146 coupled to the cover housing 140. The depressed section 212 of the door 146 is inwardly curved or concave, and the handle 214 is approximately centered within the depressed section 212 for gripping with one's fingers to remove the door 146 and permit access to the fuse 270 from the exterior of the module 102.

While in the exemplary embodiment the fuse access door 146 is removable from the cover housing 140 to provide clear access to the fuses 270, in an alternative embodiment the door 146 may be hinged or otherwise affixed to the cover housing 140 but nonetheless movable relative to the housing to provide access to the fuses 270 within the housing 144.

A sealed control module 102 is therefore provided for interconnecting brake monitors 104 and which is suitable for locating the module 102 exterior to the vehicle. The module 102 collects signals from the monitors 104 and outputs one signal line to the vehicle dashboard indicator 108. Molded in receptacles 176 avoid separately provided connector components and eliminate associated cost and reliability issues. Mating engagement with 0.64 GET terminal system connectors facilitates versatile and secure interconnection of the monitors 104. The fuse access door 146 provides easy access to the fuses 270 in the module 102 for servicing and replacement of the module. The seals 190 and 204 provide a sealed enclosure for the electronics to withstand extreme operating conditions.

While the invention has been described in terms of various specific embodiments, those skilled in the art will recognize that the invention can be practiced with modification within the spirit and scope of the claims.

What is claimed is:

1. An electronic module comprising:

an insulative housing having opposed first and second surfaces;

at least one circuit board contained within said housing;

a plurality of connectors coupled to said circuit board, at least some of said connectors accessible within openings extending through the first surface of said housing;

at least one fuse electrically coupled to said circuit board; and an insulative fuse door sealingly engaged to the second surface of said housing and positionable with respect to said housing to provide access to said fuse from an exterior of said housing, the fuse door having an upstanding handle portion being substantially flush with the second surface when the fuse door is attached thereto, and the fuse door providing a moisture-proof barrier when in a closed position, thereby protecting the at least one circuit board when the housing is located in an exterior location for ready serviceability of the module by replacement of the fuse.

2. A module in accordance with claim 1 wherein said housing comprises a connector portion defining the first surface and a cover portion sealingly engaged to said connector portion and defining the second surface.

3. A module in accordance with claim 1 wherein said housing comprises a plurality of integrally molded connector receptacles extending outwardly from the first surface and away from the second surface.

4. A module in accordance with claim 1 wherein said connectors are configured to engage 0.64 GET terminal system connectors.

5. A module in accordance with claim 1 further comprising a second circuit board contained in said housing.

6. A module in accordance with claim 1 wherein said fuse door includes side walls and a curved outer surface extending between the side walls.

7. A module in accordance with claim 1 wherein said fuse door comprises an exterior surface, at least a portion of said exterior surface being depressed relative to the second surface of said housing.

8. A module in accordance with claim 1 wherein said fuse door is removable from said housing.

9. A sealed electronic input/output module for an exterior location, the module comprising:

an insulative housing having a plurality of integrally formed connector receptacles on one side of the housing;

at least one printed circuit board contained within said housing;

a plurality of connectors coupled to said circuit board and extending into said connector receptacles;

at least one fuse electrically coupled to said circuit board; and an insulative fuse door sealingly engaged to said housing beneath the connector receptacles to provide a moisture proof barrier at the exterior location, said fuse door having an understanding handle portion being substantially flush with the housing when the fuse door is attached thereto, and said fuse door being positionable to provide access to said fuse from an exterior of said housing.

10. An input/output module in accordance with claim 9 wherein said housing comprises a connector portion and a cover portion, said connector receptacles formed in said connector portion, said fuse door coupled to said cover portion opposite said connector portion.

11. An input/output module in accordance with claim 9 wherein said connectors are configured to mate with 0.64 GET terminal system connectors.

12. An input/output module in accordance with claim 9 further comprising a second circuit board contained in said housing.

13. An input/output module in accordance with claim 9 wherein said fuse door is curved on one side thereof.

14. An input/output module in accordance with claim 9 wherein said fuse door comprises side walls and an exterior surface, at least a portion of said exterior surface being concave in an area spaced from said side walls.

15. An input/output module in accordance with claim 9 wherein said fuse door is removable from said housing.

16. An input/output module in accordance with claim 9 wherein said housing comprises:

a first portion having a sealing groove;

a second portion having a sealing rim received in said groove; and a seal member positioned in said groove and compressed by said rim.

17. An input/output module in accordance with claim 9 wherein said fuse door comprises an outer perimeter and a seal member substantially coextensive with said outer perimeter.

18. An electronic control module comprising:

an insulative housing comprising a connector portion having a plurality of integrally formed connector receptacles on an upper surface thereof, and a cover portion sealingly engaged to said connector portion opposite said connector portion;

at least one printed circuit board contained within said housing;

a plurality of connectors coupled to said circuit board and extending into said connector receptacles;

at least one fuse electrically connected to said circuit board; and an insulative fuse door removably engaged to a lower surface of said cover portion, said fuse door having a recessed handle portion, and said fuse door having a seal providing a moisture proof barrier when said fuse door is attached to said housing.

19. A control module in accordance with claim 18 wherein said connectors are configured to mate with 0.64 GET terminal system connectors.

20. A control module in accordance with claim 18 wherein one of said connector portion and said cover portion comprises a sealing groove, the other of said connector portion and said cover portion comprises a sealing rim, and said control module further comprising a seal member positioned in said groove and compressed by said rim when said cover portion is coupled to said connector portion.

* * * * *